United States Patent [19]

King et al.

[11] Patent Number: 5,616,953
[45] Date of Patent: Apr. 1, 1997

[54] LEAD FRAME SURFACE FINISH ENHANCEMENT

[75] Inventors: Jerrold L. King; Syed S. Ahmad, both of Boise; Jerry M. Brooks, Caldwell, all of Id.

[73] Assignee: Micron Technology, Inc., Boise, Id.

[21] Appl. No.: 300,695

[22] Filed: Sep. 1, 1994

[51] Int. Cl.$^6$ .................... H01L 23/48; H01L 29/40
[52] U.S. Cl. .................... 257/666; 257/696; 257/750; 257/762; 257/766
[58] Field of Search .................... 257/666, 692, 257/696, 723, 734, 750, 761, 762, 780, 766

[56] References Cited

U.S. PATENT DOCUMENTS 4,707,724  11/1987  Suzuki et al. .................... 257/766
5,331,235   7/1994  Chun .................... 257/723

FOREIGN PATENT DOCUMENTS

76007B/42  9/1979  Japan .................... 257/762
62-92350   4/1987  Japan .................... 257/762

Primary Examiner—Stephen Meier
Assistant Examiner—Carl Whitehead, Jr.
Attorney, Agent, or Firm—Workman, Nydegger & Seeley

[57] ABSTRACT

An multiple lead semiconductor integrated circuit package incorporating a silicon die wire bonded to a lead frame plated by high purity copper. The die and the lead frame are encapsulated in an epoxy compound with lead fingers from the lead frame extending outside of the encapsulated compound. The high copper plating on the lead frame, which lead frame is not composed of high purity copper, increases the conductivity thereof so as to improve the signal speed for the lead frame. A thinner copper plating on the lead frame can be used without a decrease in signal speed as frequency of the signal is increased.

24 Claims, 3 Drawing Sheets

LEAD FRAME SURFACE FINISH ENHANCEMENT

THE TECHNICAL FIELD

This disclosure relates generally to lead frames incorporated into semiconductor packages and more particularly relates to improvements in signal speed of lead frames through copper plating of the lead frame that is incorporated into semiconductor packages.

BACKGROUND OF THE INVENTION

Lead frames, which form a fundamental component of semiconductor packages, are formed from conductive metal films or strips which are manufactured through photolithographic etching processes, metal punching or stamping processes, or other processes. The starting material for such processes generally involves a single strip of metal from which the lead frame is manufactured. The lead frame forms a primary interconnect component in plastic encapsulated semiconductor packages.

After the process which creates the lead frame, the lead frame may then be plated with a metallic plating which then is wire bonded to a silicon die. The silicon die, the lead frame, and the wire bonding are encapsulated together within a molded package, which may consist of an epoxy molding compound.

The purpose of the metallic plating upon the lead frame is to enhance or otherwise increase the conductivity of the lead frame. Lead frames that are poor in electrical conductivity, poor in magnetic permeability, and which have undesirable inductance characteristics will in turn have a poor signal speed therefrom. By metallic plating of the lead frames having such deleterious characteristics, a better signal speed can be achieved if the metallic plating is a better electrical conductor, has good magnetic permeability, thereby lowering the inductance of the lead frame itself.

The skin depth of the metallic plating on the lead frame is a relevant factor to the signal speed in that the current density will be greater in the plating than in the lead frame. In a principle called skin effect, the electrons in the signal have a propensity to travel on the outside of a surface of a conductor. Due to the magnetic domain of the material, the tightness of the packing of the electrons on the outside surface of the material is dependant upon the material properties of the conductor. Ultimately, the conductivity and skin depth of the plating on the lead frame will dictate the speed of the signal through lead frame.

With an improved signal speed, a semiconductor package into which the lead frame is incorporated will be able to respond to devices having a similar signal speed. For example, a microprocessor having a fast clock speed requires equally fast memory devices having fast signal speeds in order to keep up with the clock speed of the microprocessor. By maximizing the signal speed of lead frames in memory devices, a processing bottleneck is less likely to occur and speed compatibility with an associated microprocessor will be achieved.

An example of metallic plating for lead frames is silver plating. Silver is known to be a fair conductor and accomplishes a reduction of the inductance of a less conductive lead frame. A problem exists with silver plating of lead frames due to migration of the silver. This migration problem manifests itself in the formation of whiskers or thin crystal-like structures of silver that grow between two biased leads so as to cause a short.

Another problem with silver plating is that, as a precious metal, it is expensive and adds significantly to the cost in manufacturing the plated lead frame. Thus, there is a natural tendency to disfavor semiconductor packages having silver plating on or near the leads external to the package thereon which may be the source of a silver migration problem.

SUMMARY AND OBJECTS OF THE INVENTION

In overcoming the aforementioned disadvantages in the art, it is an object of the present invention to achieve a fast signal speed by metallic plating of a lead frame with a highly conductive plating having good magnetic permeability properties, low inductance properties, low cost, and low migration tendencies.

In order to achieve the foregoing objectives, there is provided a semiconductor package comprising a semiconductor die, a lead frame having a metallic plating thereon, and a wire bond electrically interconnecting the semiconductor die and the lead frame. The lead frame, wire bonding, and semiconductor die are encapsulated in a compound. The lead frame is composed of less than 99.9% copper, and the metallic plating thereon is composed of at least 99.9% copper. The lead frame has at least one lead finger having an end inside and covered by the compound and an opposite free end extending from the lead frame outside and uncovered by the compound. The high conductivity of the copper plating improves the signal speed from the lead frame. The copper plating can be bonded to the lead frame in any known manner including cladding, electrical plating, laminating, etc.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawing depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The following disclosure of the invention is submitted in furtherance with the constitutional purpose of the United States patent laws "to promote the progress of science and useful arts" (Article 1, Section 8).

Figure 1:
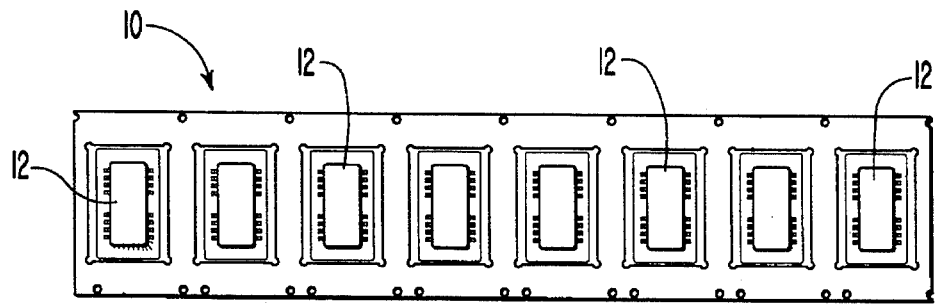
FIG. 1 is an eight (8) unit lead frame strip seen in a planar view, and is commonly referred to as an eight-up lead frame.

In accordance with the invention, FIG. 1 illustrates an eight (8) lead frame metallic strip, generally indicated at 10, each of the eight (8) lead frames being indicated by the reference numeral 12.

Figure 2:
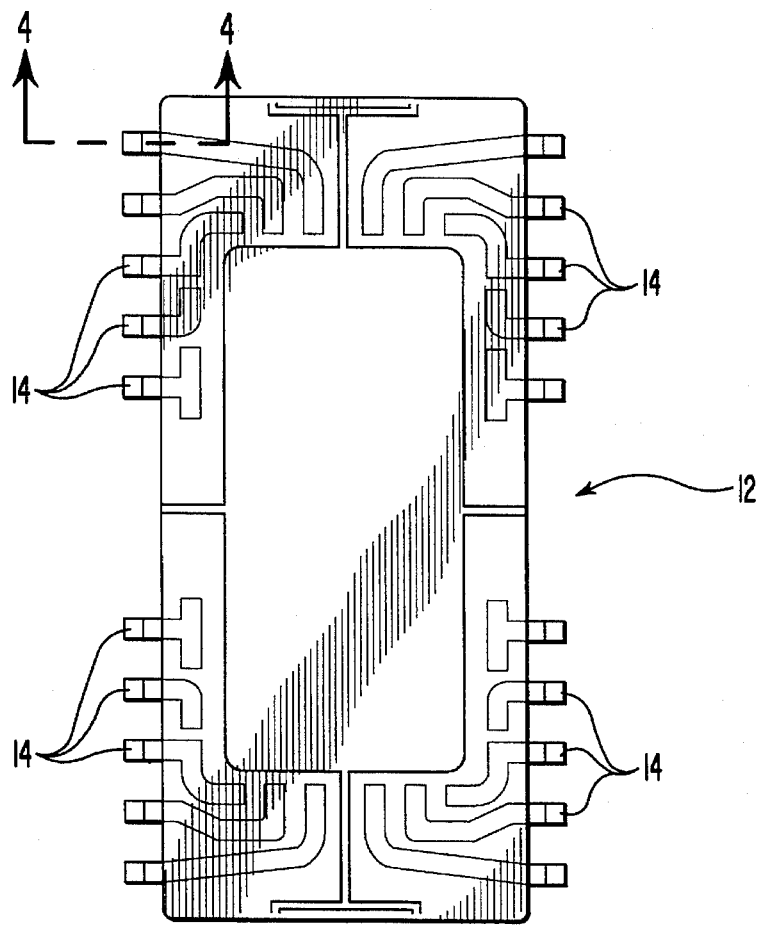
FIG. 2 is a cross-sectional view inside a molded semiconductor package and particularly shows the lead frame having twenty (20) externally extending lead fingers.

FIG. 2 shows one of the eight (8) lead frames 12 seen in FIG. 1, and further depicts lead frame 12 in greater detail with twenty (20) lead fingers 14 extending from lead frame 12.

Figure 3:
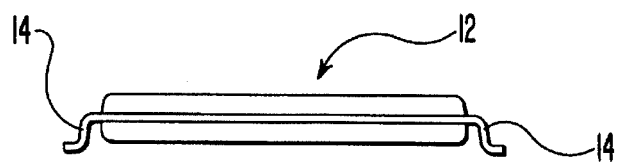
FIG. 3 is an end view of the lead frame showing two lead fingers that are located at an end of the lead frame.

FIG. 3 depicted the end view of lead frame 12 and particularly shows two of the twenty lead fingers 14 which extend from lead frame 12.

Figure 4:
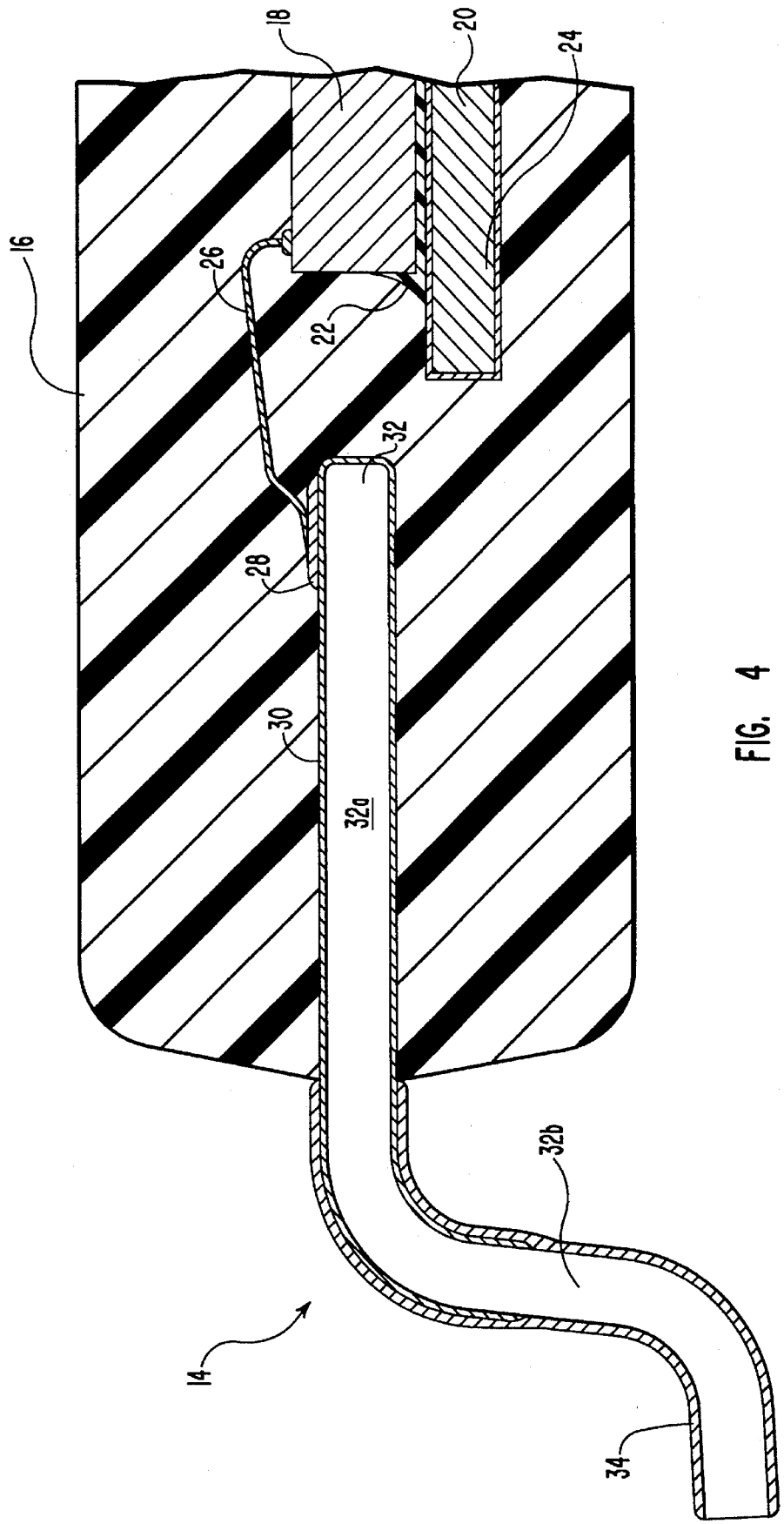
FIG. 4, which is a cross-sectional view taken along the 4—4 section line of FIG. 2, shows a diagrammatic sectional view of a plated lead frame encapsulated in an epoxy molding compound and connected to a silicon die by wire bonding, which silicon die is mounted with die attach epoxy to a die attach paddle, the foregoing being mounted in a thin-small-outline in-line package having an external lead finger extending therefrom and being plated over by a solderable plating material.

FIG. 4 illustrates an inline lead frame design commonly called a thin-small-outline package from which lead finger 14 extends. Encapsulated within an epoxy molding compound 16 is a silicon die 18, the later serving as an example to illustrate a semiconductor die. Silicon die 18 is superjacent to a die attach paddle 20 and is connected to silicon die 18 by a coating of die attach epoxy 22. Die attach paddle 20 has a copper plating 24 thereon. A gold wire 26 serves as an example of a means for electrically interconnecting the silicon die and the lead frame. Gold wire 26 is attached to silicon die 18 at one end thereof, and is attached at the other end thereof to a silver plating 28. Silver plating 28 is preferably electroplated onto a copper plating 30. Copper plating 30 covers a lead finger core 32 which has an inside lead section 32a within compound 16 and external lead section 32b which extends to a free end outside and uncovered by compound 16. External lead section 32b has a solderable lead-tin plating 34 thereon.

Figure 5:
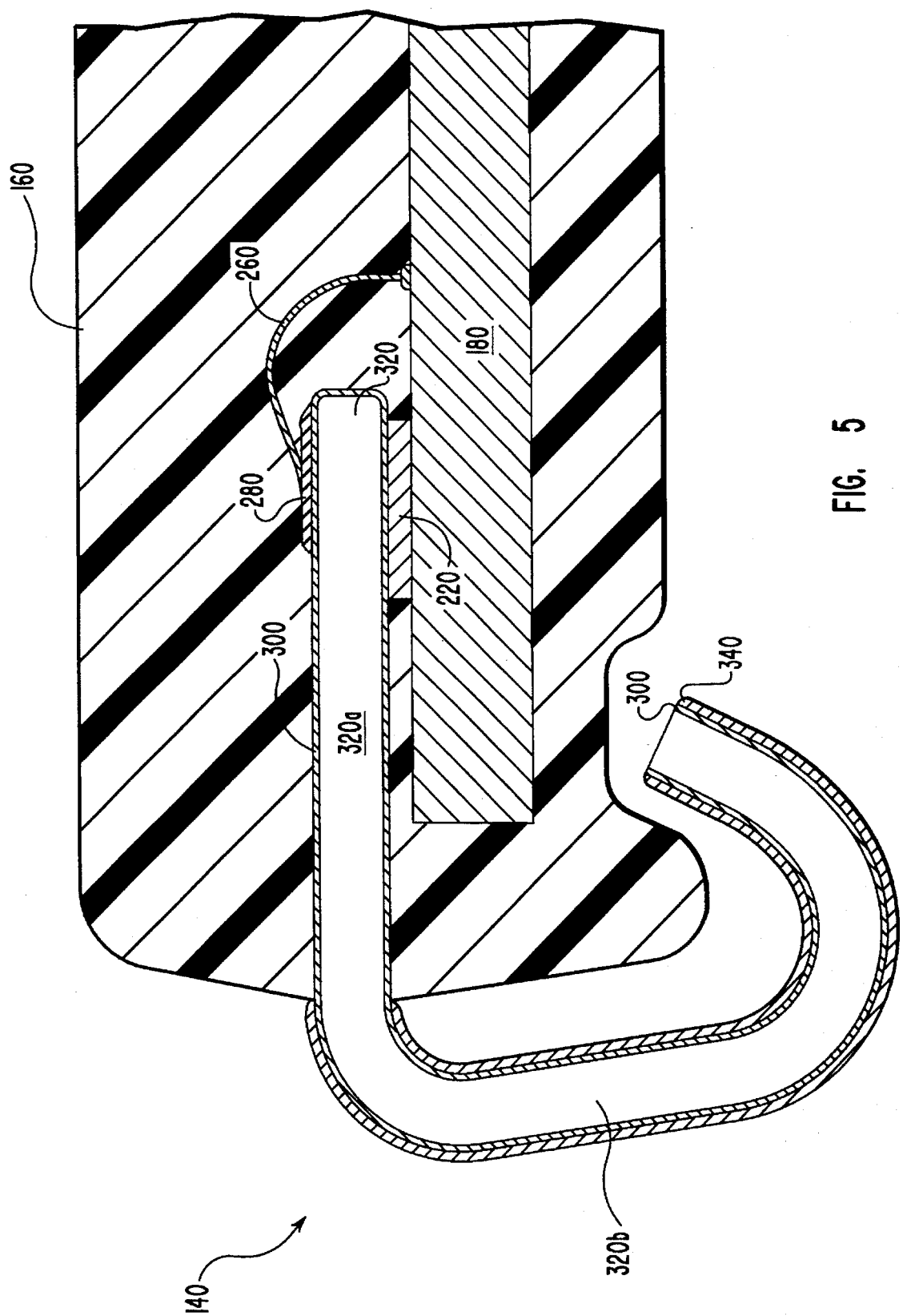
FIG. 5, which is an alternative embodiment to that of FIG. 4, shows a diagrammatic sectional view of a lead finger over a silicon die and attached thereto by adhesive tape and wire bonding. The lead finger and silicon die are encapsulated within a molded package. The lead finger extends outside of the molded package and has a copper alloy plating thereon, and a superjacent solderable lead-tin plating on the copper plating. The semiconductor package depicted in FIG. 5 is a small-outline J-bend in-line package.

FIG. 5 is an alternative embodiment of an inline-lead package, particularly a small-outline J-lead package, for which a trailing zero has been added to the reference numerals of the components that are similar in purpose to components seen in FIG. 4. A molded package 160 has lead finger 140 extending therefrom in the form of a J-bend. Molded package 160 encapsulates a silicon die 180 which is mounted under lead finger 140. Silicon die 180 is adhesively attached to lead finger 140 by adhesive tape 220 in a configuration which can be described as lead-over-chip. Adhesive tape 220 is nonconductive and secures lead finger 140 to silicon die 180. A gold wire 260 serves as another example of a means for electrically interconnecting the silicon die and the lead frame in a semiconductor package. Gold wire 260 is attached to the surface of silicon die 180 at one end thereof, and is attached to a silver plating 280 at the other end thereof. Silver plating 280 is electroplated onto a copper plating 300 on lead finger 140. Thus, silicon die 180 is wire bonded by gold wire 260 to lead finger 140.

Lead finger 140 has an internal conductive lead finger core 320 having internal section 320a within compound 160, and an outside section 320b which extends outside of and is uncovered by compound 160. Copper plating 300 extends the full length of lead finger core 320 over inside section 320a and over outside section 320b. Outside section 320b has an additional plating of a lead-tin alloy 340 on top of copper coating 300. Lead-tin plating 340 is desirable over external section 320b to improve the solderability of external lead 320b. Specifically, a lead-tin alloy is better in solderability than is copper plating 300.

The process by which thin-small-outline package in FIG. 4 is made and the process by which the small-outline J-Lead package of FIG. 5 are different in that the result of the thin-small-outline package process limits the extent of copper plating upon external section 32b of lead finger 32. The limitation of copper plate 30 upon external section 32b is done by stripping off the copper plating after a copper plating step. Alternatively, masking external lead 32b such that the copper treatment will be limited to a small section thereof will also suffice. The small-outline J-bend package process results in the entire length of external lead 320b being plated by both a copper plate 300 and a plate of lead-tin alloy 340. The determination of whether to coat the entire external section of the core lead of the lead finger of the lead frame with a copper plate is a solderability performance issue which is within the discretion of the subsequent user of the semiconductor package.

In either of the disclosed embodiments, it is desirable to provide a copper plating over the entire lead frame, other than as disclosed above with respect the issue of solderability. It is preferable to provide a copper plating having a skin depth ranging from about 0.00002 inches to about 0.0006 inches. It is desirable that the copper plating be relatively pure copper or at least 99.9% copper, and that the lead frame material be made from other than high purity copper or less than 99.9% copper. By way of example, and not by way of limitation, a lead frame material having a composition of 42% nickel and substantially the rest of iron in content that has a copper plating thereon will have an improved conductivity due to the copper plating. This lead frame material has an IACS conductivity rating of about 3.0%. Consequently, the lead frame signal speed of such a semiconductor package will be improved.

Lead frames being composed of conductive material close to that of pure copper will have signal speeds of a lesser improved margin when plated by pure copper. Thus, a lead frame having poor conductivity and poor magnetic permeability can be improved by a plating of copper having a purity of at least 99.9% or better due to its inherent characteristics of high conductivity and low or good magnetic permeability.

Copper coating of a lead frame in other semiconductor packages is also within the scope of the present invention including a number of different packages such as dual inline packages (DIP), the aforementioned small-outline J-lead package (SOJ), single inline packages (SIP), zig-zag inline packages (ZIP), as well as other variations of the single-row and double-row inline-lead multiple lead semiconductor integrated circuit packages.

Table A, shown below, depicts skin depth ($\delta$) as a function of frequency (f), conductivity ($\sigma$), and magnetic permeability ($\mu$), for a variety of materials as modeled by the following Equation A.

Equation A:

$$\delta = \frac{1}{(\pi f \sigma \mu)^{1/2}}$$

Table A presupposes a lead frame having thereon a plating composed of the material shown in the first column and having a skin depth δ, which produces a signal speed of 1÷f as shown in nanoseconds. Table A also shows μ–1 as a measure of permeability in units of Gaus per Oestad. One Gaus per Oestad is equal to $4\pi 10^{-7}$. Magnetic permeability μ is shown in units of Henrys divided by meters. Conductivity, σ, is shown in MOH/m units, and frequency is shown in Hertz. Skin depth (δ) is shown first in meters, and second in $10^{-6}$ inches. The resistance (r) is shown in units of ohm-meters.

From Table A, them is shown the desirable skin depth, δ, for various materials as frequency f is varied. Particularly shown is the superior performance of high purity copper Cu102 which is 99.95 copper having an ASTM Specification No. B152.

The material Cu194 is composed of 97.5% copper, 2.35% iron, 0.03% phosphorous, and 0.12% zinc. The material Alloy 42 is composed of approximately 42% lead and substantially the rest iron. The materials lead and tin are self-explanatory in Table A. The material PB10/SN90A % is 10% lead and 90% tin. The material PB25/SN75A % is 25% lead and 75% tin.

TABLE A

| Plating Matl. | u – 1 (Gaus/ Oested) | u (Henry/ m) | r(Ohm-m) | σ(Moh/m) | F(Hz) | σ(m) | σ($10^{-6}$ in) | Speed (nano- sec) |
| --- | --- | --- | --- | --- | --- | --- | --- | --- |
| Alloy42 | 40 | 5.15E – 05 | 6.3E – 07 | 1587302 | 1E + 09 | 1.97E – 06 | 77 | 1 |
| LEAD | | 1.26E – 06 | 2.00E – 7 | 5000000 | 1E + 09 | 1.0E – 05 | 280 | 1 |
| TIN | | 1.26E – 06 | 1.00E – 07 | 10000000 | 1E + 09 | 5.03E – 06 | 198 | 1 |
| Pb10/Sn90 a % | | 1.26E – 06 | 4.60E – 07 | 2173913 | 1E + 09 | 1.08E – 05 | 424 | 1 |
| Pb25/Sn75 a % | | 1.26E – 06 | 5.00E – 07 | 2000000 | 1E + 09 | 1.13E – 05 | 443 | 1 |
| Cu102 | 0.00001 | 1.26E – 06 | 1.72E + 08 | 58001276 | 1E + 09 | 2.09E – 06 | 82 | 1 |
| Cu102 | 0.00001 | 1.26E – 06 | 1.72E – 08 | 58001276 | 2E + 09 | 1.48E – 06 | 58 | 0.5 |
| Cu102 | 0.00001 | 1.26E – 06 | 1.72E – 08 | 58001276 | 1E + 08 | 6.61E – 06 | 260 | 10 |
| Cu102 | 0.00001 | 1.26E – 06 | 1.72E – 08 | 58001276 | 2E + 07 | 1.48E – 05 | 581 | 50 |
| Cu194 | 0.1 | 1.38E – 06 | 2.65E – 8 | 37700829 | 1E + 09 | 2.74E – 06 | 97 | 1 |

In compliance with the patent statute, the invention has been described in language more or less specific as to structural features. The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. A semiconductor package comprising:

a semiconductor die;

a lead frame having a conductivity IACS rating of less than or equal to about 3.0%, comprising a frame and a lead finger;

a plate, composed of at least 97.5% copper substantially covering the lead frame;

means for electrically interconnecting the semiconductor die and the lead frame; and a compound substantially encapsulating the semiconductor die, the lead frame, and the means for electrically interconnecting the semiconductor die and the lead frame, the lead finger having an end on the frame inside and covered by the compound and an opposite free end extending from the frame outside and uncovered by the compound.

2. The semiconductor package as defined in claim 1, wherein the plate has a substantially constant thickness of less than 0.0006 inches.

3. The semiconductor package as defined in claim 2, wherein the plate has a substantially constant thickness of at least 0.00002 inches.

4. The semiconductor package as defined in claim 1, wherein the plate is composed of at least about 99.9% copper.

5. The semiconductor package as defined in claim 1, wherein the lead frame is composed of substantially no copper.

6. The semiconductor package as defined in claim 1, wherein the plate is further composed of about 0.15% phosphorous.

7. The semiconductor package as defined in claim 1, wherein the lead frame has a magnetic permeability of less than or equal to about 5.15 E-05 Henry/meters.

8. The semiconductor package as defined in claim 1, further comprising a plurality of lead fingers, each lead finger of said plurality of lead fingers having an end on the frame inside and covered by the compound and an opposite free end extending from the frame outside and not covered by the compound.

9. The semiconductor package as defined in claim 8, wherein the semiconductor package is an inline-lead package.

10. The semiconductor package as defined in claim 9, wherein the semiconductor package is a thin-small-outline package.

11. The semiconductor package as defined in claim 9, wherein a portion of each said lead finger that is uncovered by the compound is partially covered by both the plate and a lead-tin plating, and is partially covered solely by the lead-tin plating.

12. The semiconductor package as defined in claim 9, wherein the semiconductor package is a small-outline J-lead package.

13. The semiconductor package as defined in claim 11, wherein the portion of each said lead finger that is uncovered by the compound is covered by both the plate and a lead-tin plating.

14. The semiconductor package as defined in claim 1, wherein the means for electrically interconnecting the semiconductor die and the lead frame comprises a bonding wire.

15. The semiconductor package as defined in claim 1, wherein the means for electrically interconnecting the semiconductor die and the lead frame comprises tab bonding.

16. The semiconductor package as defined in claim 1, wherein the means for electrically interconnecting the semiconductor die and the lead frame comprises adhesive bonding.

17. The semiconductor package as defined in claim 1, wherein the semiconductor die is a silicon die.

18. The semiconductor package as defined in claim 1, wherein the semiconductor die is gallium arsenide.

19. A semiconductor package comprising:

a semiconductor die;

a lead frame, composed of substantially no copper, comprising a frame and a lead finger;

a plate substantially covering the lead frame and being composed of at least 97.5% copper;

means for electrically interconnecting the semiconductor die and the lead frame; and a compound substantially encapsulating the semiconductor die, the lead frame, and the means for electrically interconnecting the semiconductor die and the lead frame, the lead finger having an end on the frame inside and covered by the compound and an opposite free end extending from the frame outside and uncovered by the compound.

20. The semiconductor package as defined in claim 19, wherein said plate is composed of at least 99.9% copper.

21. The semiconductor package as defined in claim 19, wherein the lead frame has a conductivity IACS rating of less than or equal to about 3.0%.

22. A semiconductor package as defined in claim 21, further comprising a plurality of lead fingers, each lead finger of said plurality of lead fingers having an end on the frame inside and covered by the compound and an opposite free end extending from the frame outside and not covered by the compound.

23. The semiconductor package as defined in claim 22, wherein the semiconductor package is an inline-lead package, and wherein a portion of each said lead finger that is uncovered by the compound is partially covered by both the plate and a lead-tin plating, and is partially covered solely by the lead-tin plating.

24. The semiconductor package as defined in claim 23, wherein the portion of each said lead finger that is uncovered by the compound is covered by both the plate and a lead-tin plating.

* * * * *